US011425845B2

(12) United States Patent
Rodriguez

(10) Patent No.: US 11,425,845 B2
(45) Date of Patent: *Aug. 23, 2022

(54) RACK HOUSINGS HAVING AN ADJUSTABLE AIR VOLUME

(71) Applicant: International Business Machines Corporation, Armonk, NY (US)

(72) Inventor: Jean-Michel Rodriguez, Mauguio (FR)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 434 days.

This patent is subject to a terminal disclaimer.

(21) Appl. No.: 16/368,914

(22) Filed: Mar. 29, 2019

(65) Prior Publication Data

US 2019/0230821 A1 Jul. 25, 2019

Related U.S. Application Data

(63) Continuation of application No. 14/924,921, filed on Oct. 28, 2015, now Pat. No. 10,306,808.

(51) Int. Cl.
*H05K 7/20* (2006.01)
*H05K 7/14* (2006.01)

(52) U.S. Cl.
CPC ....... *H05K 7/20736* (2013.01); *H05K 7/1488* (2013.01)

(58) Field of Classification Search
CPC ............ H05K 7/20736; H05K 7/1488; H05K 7/1489; H05K 7/18; H05K 7/20709
USPC .......................................................... 454/184
See application file for complete search history.

(56) References Cited

U.S. PATENT DOCUMENTS

| | | | |
|---|---|---|---|
| 7,112,131 B2 | 9/2006 | Rasmussen | |
| 8,290,629 B1 | 10/2012 | Mateski et al. | |
| 8,407,004 B2 | 3/2013 | Ware | |
| 8,626,346 B2 | 1/2014 | Archibald et al. | |
| 8,638,553 B1 | 1/2014 | Czamara | |
| 10,306,808 B2 | 5/2019 | Rodriguez | |
| 2005/0208888 A1 | 9/2005 | Moore et al. | |
| 2013/0273825 A1 | 10/2013 | Uno et al. | |
| 2014/0014292 A1 | 1/2014 | Rice et al. | |

OTHER PUBLICATIONS

P. Mell, et al. "The NIST Definition of Cloud Computing", NIST Special Publication 800-145, Sep. 2011, Gaithersburg, MD.
Alan Katz, "Optimizing Data Center Cooling Using Differential Pressure Sensing", Packetpower.com, available online at http://www.packetpower.com/blog/Optimizing-Data-Center-Cooling-Using-Differential-Pressure-Sensing, 4 pages, Jun. 2, 2014.

(Continued)

*Primary Examiner* — Avinash A Savani
*Assistant Examiner* — Dana K Tighe
(74) *Attorney, Agent, or Firm* — Aaron Pontikos; George S. Blasiak; Heslin Rothenberg Farley & Mesiti PC

(57) ABSTRACT

A rack housing includes, for example, a frame, a door attachable to a front of said frame, a plurality of movable supports for supporting a plurality of electronic devices in the frame, and an actuator for moving said plurality of movable supports to define an adjustable air volume in the rack housing for receiving cooling air from a raised floor of a data center. Computer-implemented methods, computer program products, and systems are also disclosed.

20 Claims, 11 Drawing Sheets

(56) References Cited

OTHER PUBLICATIONS

Ahuja et al., "Real Time Monitoring and Availability of Server Airflow for Efficient Data Center Cooling", Semiconductor Thermal Measurement and Management Symposium, 2013 29th Annual IEEE, pp. 243-247. Date of Conference: Mar. 17-21, 2013.

Suhas V. Patankar, "Airflow and Cooling in a Data Center", Journal of Heat Transfer, vol. 132, Issue 7, 17 pages, Jul. 2010.

Notice of Allowance, U.S. Appl. No. 14/924,921, filed Oct. 28, 2015, dated Dec. 31, 2018.

List of IBM Patent and/or Patent Applications treated as related for U.S. Appl. No. 16/368,914, filed Mar. 29, 2019, dated Jul. 16, 2019.

RACK HOUSINGS HAVING AN ADJUSTABLE AIR VOLUME

CROSS-REFERENCE TO RELATED APPLICATION

This application is a continuation of U.S. application Ser. No. 14/924,921, filed Oct. 28, 2015, titled "Rach Housings Having an Adjustable Air Volume", which is incorporated by reference herein in its entirety.

TECHNICAL FIELD

The present disclosure relates generally to data centers, and more particularly, to rack housings, methods, computer program products, and systems for use in data centers.

BACKGROUND

A data center is a facility used for housing computer and communications equipment such as servers and storage units. A business may maintain this equipment for the purpose of handling the data necessary for its operations. The equipment is typically mounted on server racks that are arranged in single rows forming corridors between them. Each server rack has an associated rack density, or number of servers that can be stored on the rack. The racks are typically supported by a raised floor, which is comprised of a gridded metal framework or understructure that provide support for individual floor panels. Cables, wiring, electrical supplies, and various cooling components can be run underneath the floor panels of the raised floor. Conventional data centers typically have a raised floor which is complex and usually difficult, if not impossible, to change.

SUMMARY

Shortcomings of the prior art are overcome and additional advantages are provided through the provision, in one aspect, of a rack housing which includes, for example, a frame, a door attachable to a front of the frame, a plurality of movable supports for supporting a plurality of electronic devices in the frame, and an actuator for moving the plurality of movable supports to define an adjustable air volume in said rack housing for receiving cooling air from a raised floor of a data center.

In another aspect, a computer-implemented method is provided. The computer-implemented method includes, for example, receiving, by one or more processor, data in connection with a data center, and controlling, by the one or more processor, repositioning of a plurality of electronic devices disposed in a rack housing defining a first adjustable air volume in the rack housing in fluid communication with cooling air in a raised floor of the data center based on the data in connection with data center so that the plurality of electronic devices in the rack housing define a second adjustable air volume in the rack housing different from the first adjustable air volume.

In another aspect, a computer program product is provided. The computer program product includes: a computer readable storage medium readable by one or more processor and storing instructions for execution by the one or more processing unit for performing a method which includes, for example, receiving, by one or more processor, data in connection with a data center, and controlling, by the one or more processor, repositioning of a plurality of electronic devices disposed in a rack housing defining a first adjustable air volume in the rack housing in fluid communication with cooling air in a raised floor of the data center based on the data in connection with data center so that the plurality of electronic devices in the rack housing define a second adjustable air volume in the rack housing different from the first adjustable air volume.

In a further aspect, a system is provided. The system includes: a memory; and one or more processor in communication with the memory, where the system is configured to perform a method which includes, for example, receiving, by one or more processor, data in connection with a data center, and controlling, by the one or more processor, repositioning of a plurality of electronic devices disposed in a rack housing defining a first adjustable air volume in the rack housing in fluid communication with cooling air in a raised floor of the data center based on the data in connection with data center so that the plurality of electronic devices in the rack housing define a second adjustable air volume in the rack housing different from the first adjustable air volume.

Additional features and advantages are realized through the techniques set forth herein. Other embodiments and aspects are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
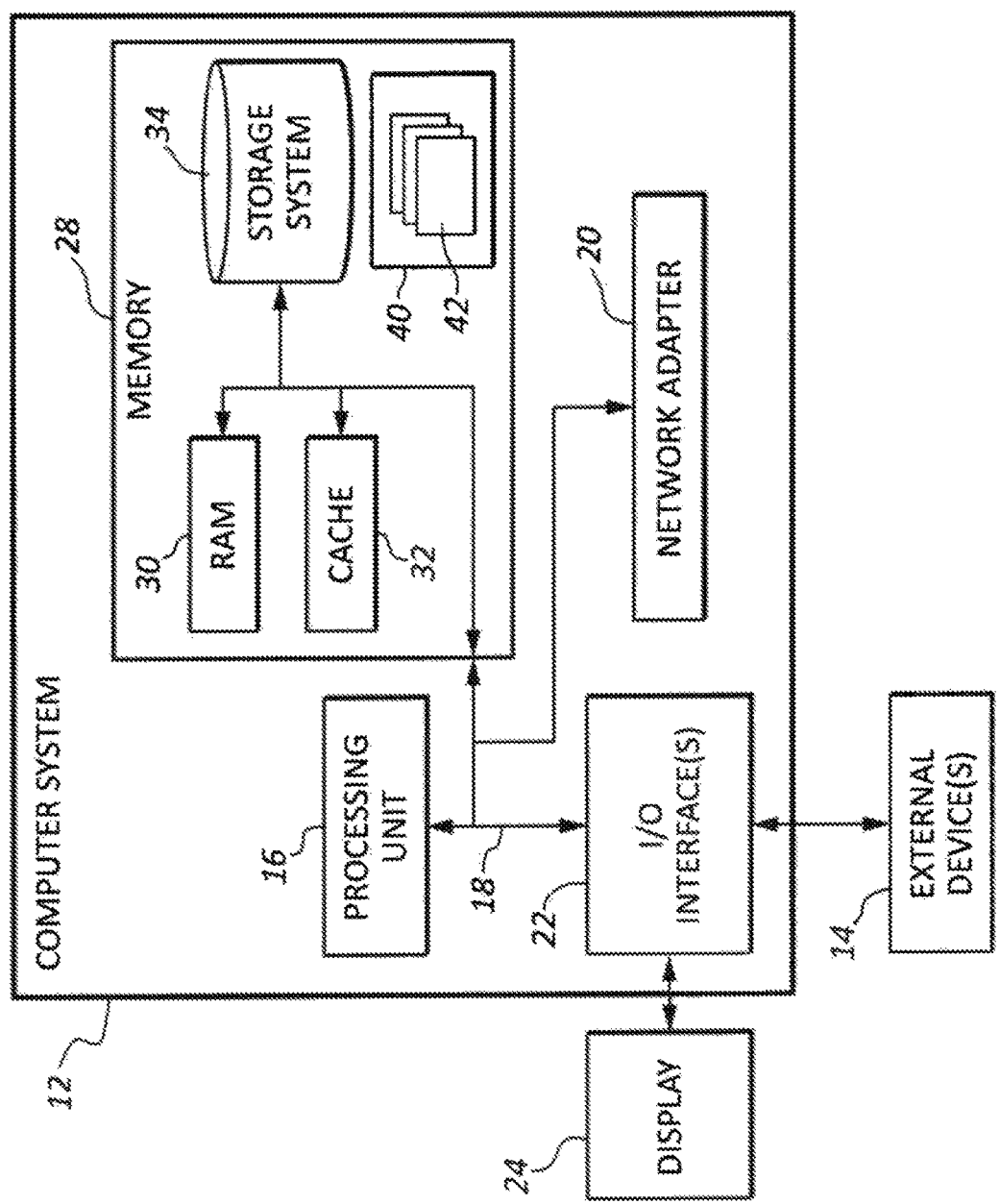
FIG. 1 depicts a cloud computing node according to an embodiment of the present invention.

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, rack housings, methods, computer program products, systems, for use in data centers. For example, a technique of the present disclosure provides a rack housing having an adjustably or adaptive sized air volume in fluid communication with cooling air in a raised floor of a data center. The air volumes of a plurality of a rack housings may be considered additional air volume that is effective added to the air volume of a fixed raised floor, which provides an increase in a total global volume of cooling air in a data center without a change in the height of the raised floor. In addition, the technique of the present disclosure may provide for dynamic adaptive air volume in rack housing or dynamic adaptive air volumes in a plurality of rack housings may be may effective to respond to the cooling needs of a rack housing, the plurality of rack housings, and/or the data center. For example, the dynamic adaptive air volume in the rack housing or dynamic adaptive air volumes in a plurality of rack housings may respond generally in real-time to the cooling needs of the rack housing, the plurality of rack housings, and/or the data center.

FIGS. 1-4 depict various aspects of computing, including cloud computing, in accordance with one or more aspects set forth herein.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system 12, which is operational with numerous other general purpose or special purpose computing system environments or configurations. Examples of well-known computing systems, environments, and/or configurations that may be suitable for use with computer system 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 12 may be described in the general context of computer system-executable instructions, such as program modules, being executed by a computer system. Generally, program modules may include routines, programs, objects, components, logic, data structures, and so on that perform particular tasks or implement particular abstract data types. Computer system 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system 12 in cloud computing node 10 is shown in the form of a general-purpose computing device. The components of computer system 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 12 typically includes a variety of computer system readable media. Such media may be any available media that is accessible by computer system 12, and it includes both volatile and non-volatile media, removable and non-removable media.

System memory 28 can include computer system readable media in the form of volatile memory, such as random access memory (RAM) 30 and/or cache memory 32. Computer system 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 12 may also communicate with one or more external devices 14 such as a keyboard, a pointing device, a display 24, etc.; one or more devices that enable a user to interact with computer system 12; and/or any devices (e.g., network card, modem, etc.) that enable computer system 12 to communicate with one or more other computing devices. Such communication can occur via Input/Output (I/O) interfaces 22. Still yet, computer system 12 can communicate with one or more networks such as a local area network (LAN), a general wide area network (WAN), and/or a public network (e.g., the Internet) via network adapter 20. As depicted, network adapter 20 communicates with the other components of computer system 12 via bus 18. It should be understood that although not shown, other hardware and/or software components could be used in conjunction with computer system 12. Examples, include, but are not limited to: microcode, device drivers, redundant processing units, external disk drive arrays, RAID systems, tape drives, and data archival storage systems, etc.

Figure 2:
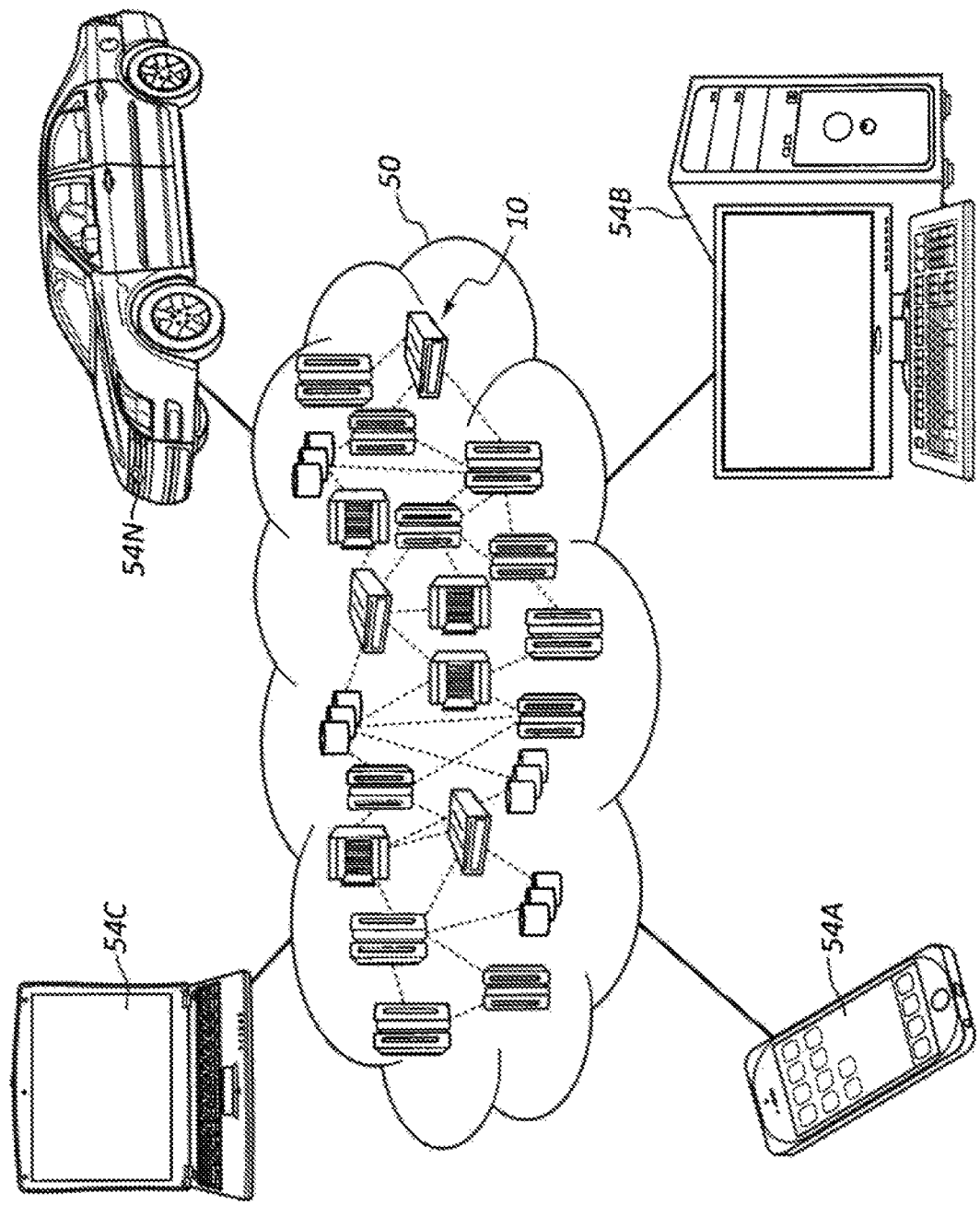
FIG. 2 depicts a cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
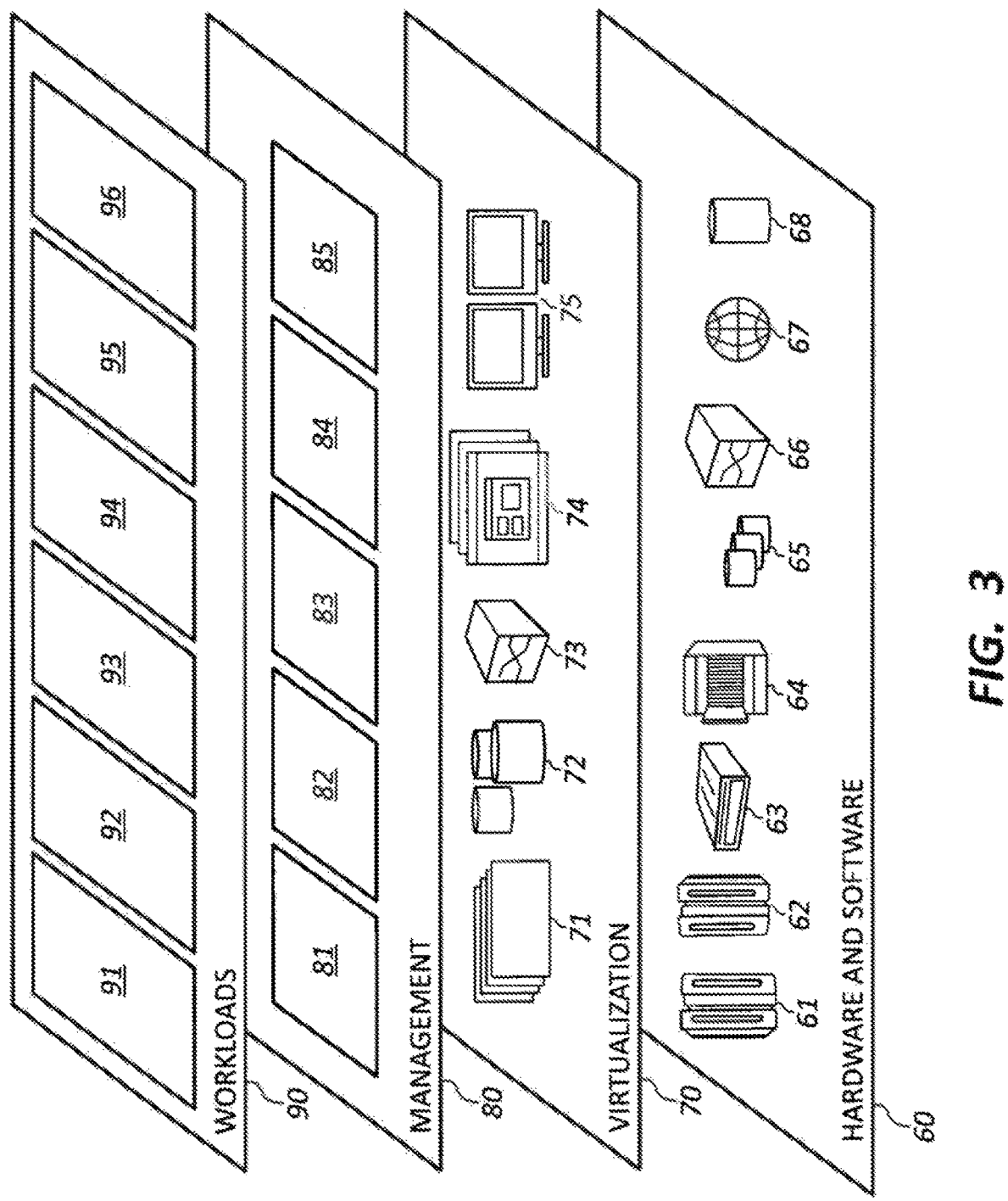
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and rack housing control resources 96 as described herein.

Figure 4:
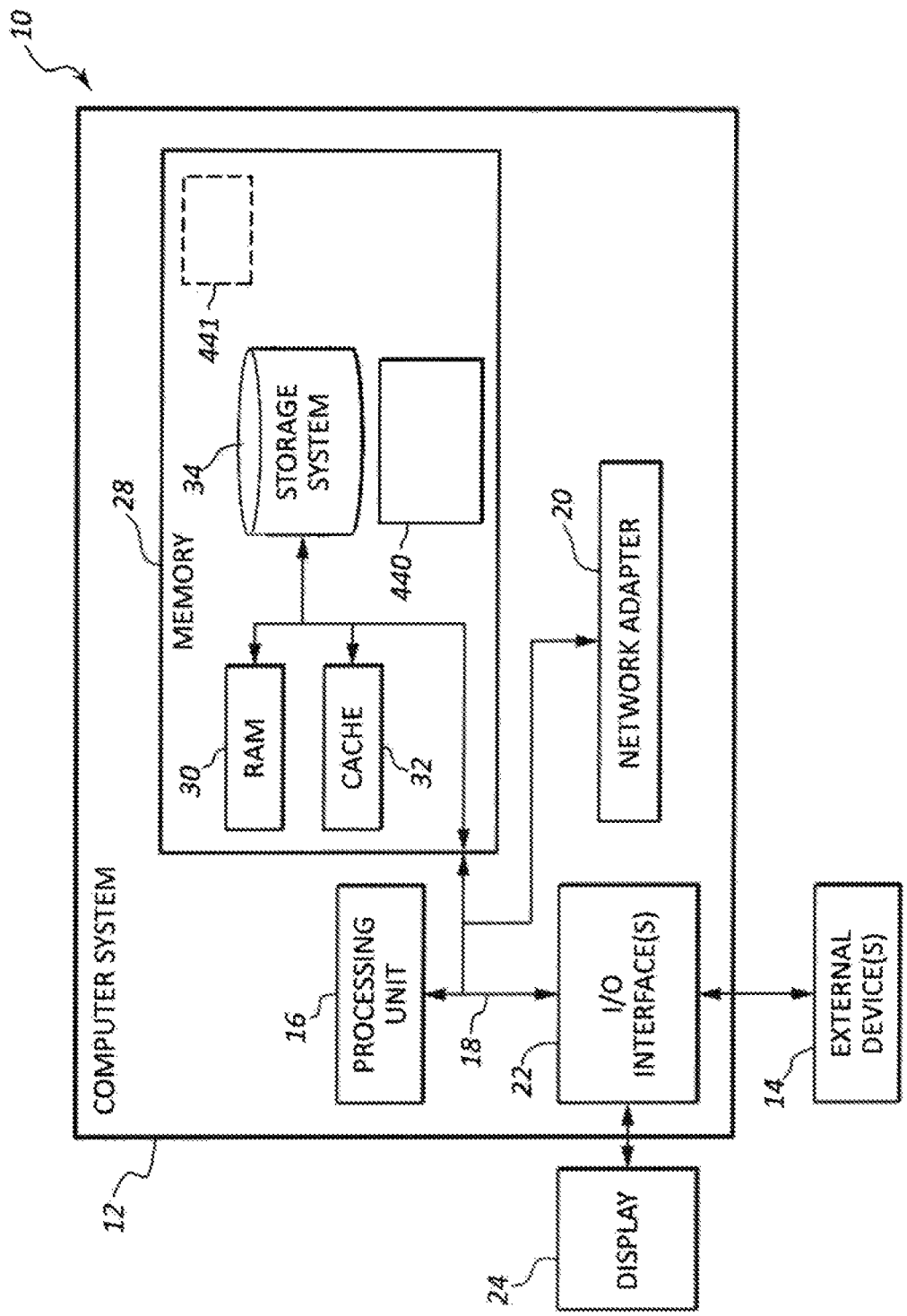
FIG. 4 depicts a hardware overview of a computing node, in accordance with one or more aspects set forth herein.

FIG. 4 depicts a hardware overview of a computing node 10, which may be a cloud computing node, in accordance with one or more aspects set forth herein. The computing node as set forth in FIG. 4 can include the hardware components as set forth in reference to computing node 10 as set forth in reference to FIG. 1. By way of example, computing node 10 may generally be any of the computing devices described herein, such as network devices, client computers, server computers, etc.

Program/utility 40 as set forth in FIG. 1 can provide the functionality of rack housing control 96 as set forth in FIG. 3. Program/utility 40 as set forth in FIG. 1 can include one or more program 440 as set forth in FIG. 4, and program/utility 40 as set forth in FIG. 1 can optionally include some or all of one or more program 441.

One or more program 440 can have a set (at least one) of program modules, and may be stored in memory 28 by way of example, and not limitation, as well as an operating system, one or more application programs, other program modules, and program data. Each of the operating system, one or more application programs, other program modules, program data, and one or more program, or some combination thereof, may include an implementation of a networking environment. One or more program 440 (and optionally at least one of one or more program 441) generally carry out the functions and/or methodologies of embodiments of the invention as described herein, such as rack housing control 96 (FIG. 3).

Referring again to FIG. 4:

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media, (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5:
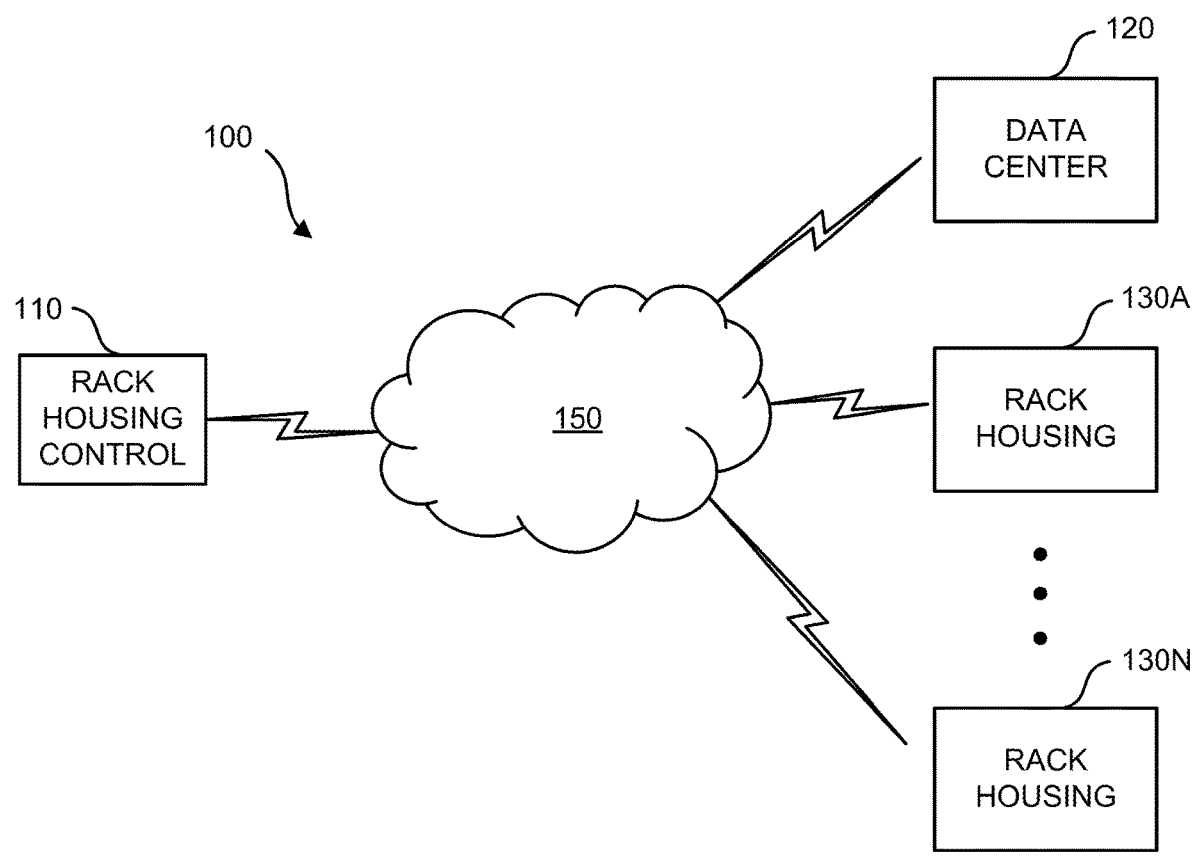
FIG. 5 is an exemplary block diagram of a system, in accordance with one or more aspects set forth herein.

FIG. 5 is an exemplary block diagram of a system 100, in accordance with one or more aspects set forth herein. For example, a network 150 may be a physical network or a virtual network. A physical network can be, for example, a physical telecommunications network connecting numerous computer nodes or systems, such as computer servers and computer clients. By contrast a virtual network can, for example, combine numerous physical networks or parts thereof into a logical virtual network. In another example, numerous virtual networks can be defined over a single physical network.

By way of explanation, FIG. 5 depicts exemplary system 100 in which one or more rack housing control 110 may control one or more configurations of a rack housing having a plurality of electronic devices. In one example, rack housing control 110 can be in communication with one or more data center 120, and one or more rack housings 130A to 130N. One or more data center 120, and one or more rack housings 130A to 130N are shown as being in communication via network 150 with rack housing control 110 may alternatively be co-located at data center 120 or may be located at one or more rack housings 130A to 130N.

Figure 6:
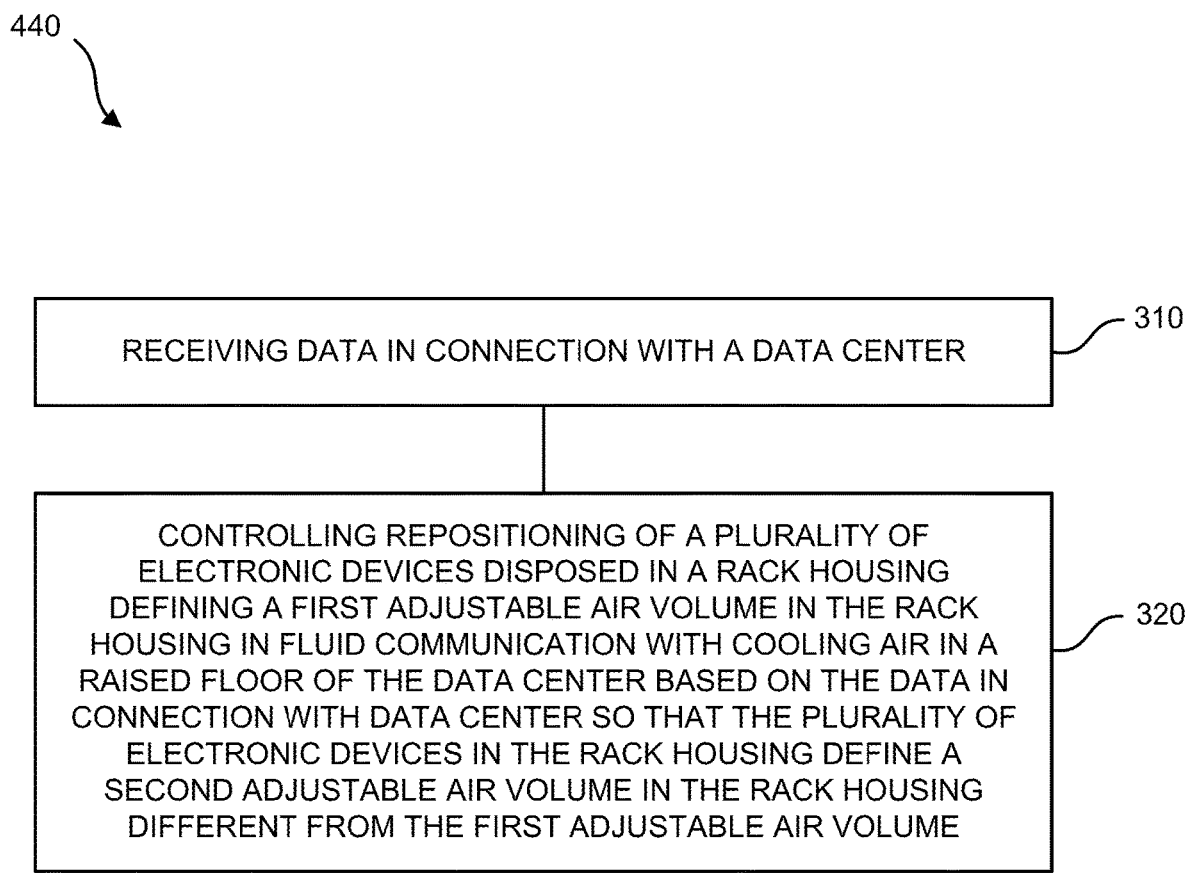
FIG. 6 is a flowchart of an embodiment of a method of the present invention.

FIG. 6 illustrates a process in accordance with aspects of the present disclosure. By way of example, the processes described with respect to FIG. 6 can be performed using one or more program 440 (FIG. 4) on one or more rack housing control 110 (FIG. 5), as detailed with respect to FIG. 4.

For example, one or more program 440 may include at 310, receiving data in connection with a data center, and at 320, controlling repositioning of a plurality of electronic devices disposed in a rack housing defining a first adjustable air volume in the rack housing in fluid communication with cooling air in a raised floor of the data center based on the data in connection with data center so that the plurality of electronic devices in the rack housing define a second adjustable air volume in the rack housing different from the first adjustable air volume.

Figure 7:
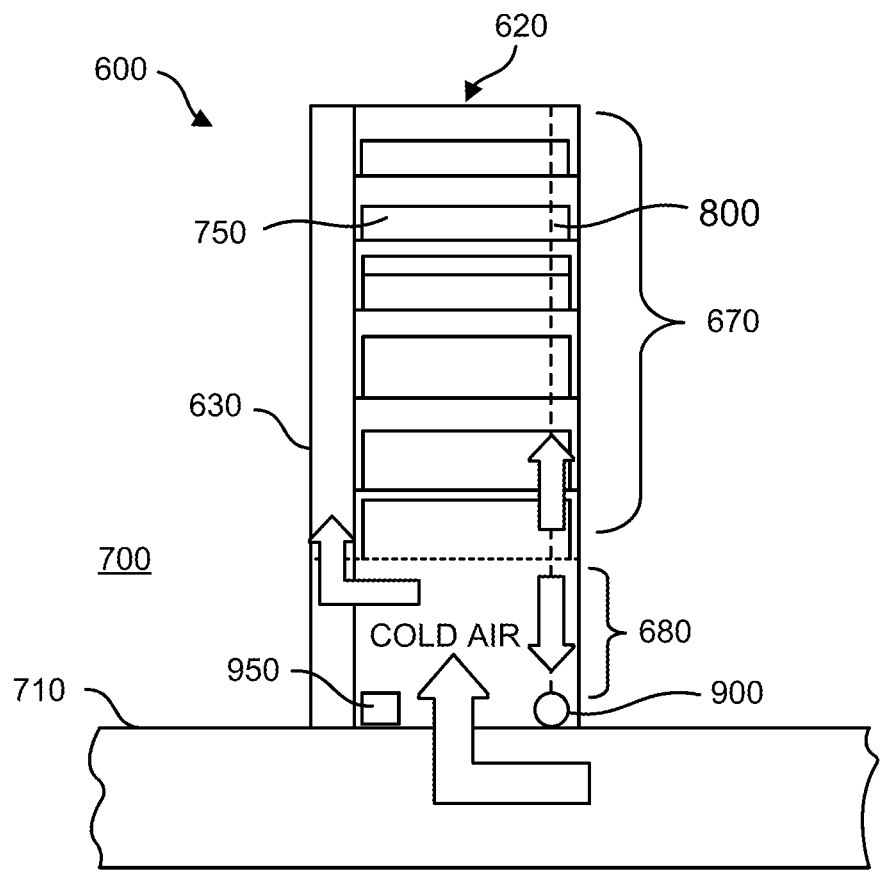
FIG. 7 is a diagrammatic illustration of an embodiment of a rack housing of the present invention.

FIG. 7 is a diagrammatic illustration, for example a cross sectional side view, of a rack housing 600 according to an embodiment of the present invention which may be disposed in a data center 700. Rack housing 600 is positionable on a raised floor 710 for receiving cooling air in the raised floor.

Figure 8:
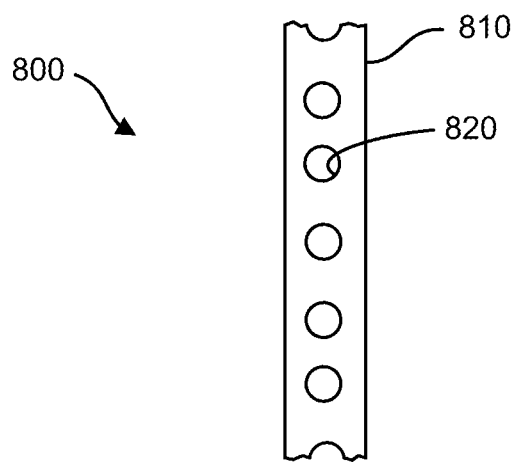
FIG. 8 is a side elevational view of a portion of a movable rail of the rack housing of FIG. 7.

Rack housing 600 may include a frame 620, a door 630 attachable to a front of the frame, one or more movable supports 800 for supporting a plurality of electronic devices 750 in the rack housing. In this illustrated embodiment, rack housing 600 may define an upper resource section 670 and an adjustable air volume section 680. As shown in FIG. 8, one or more movable support 800 may include an elongated member 810 having a plurality of apertures or holes 820 for attaching to the electronic devices. The elongated member may be formed from a suitable material such as a metal or plastic, and may have a rigid configuration or flexible configuration. With reference again to FIG. 7, an actuator 900 is operable for moving one or more movable supports 800 to change such as increase or decrease the size of upper resource section 670 and to change such as increase or decrease the size of adjustable air volume section 680. The supported electronic devices may move vertically up and down independently relative to each other in the rack housing such as move separately or fixed relative to each other such as move together. For example, the electronic devices may be slidably guided by the frame and the one or more movable supports may be used to translate the electronic devices up and down relative to the frame. Rack housing 600 may include one or more sensors 950 such as an air pressure sensor for reading air pressure in the adjustable air volume section and/or a volume sensor for measuring the volume of the adjustable air volume section.

In other embodiments of a rack housing having an adjustable air volume, the movable supports may be a scissor mechanism that is expandable and collapsible by the actuator so that the electronic devices may be repositionable in the rack housing to change the adjustable air volume. Other suitable movable supports may include one or more hydraulic, pneumatic, or motorized mechanism for moving the electronic devices independently from each other or as a unit up and down in the rack housing. Other moveable supports may employ chains, threaded rods, and/or rollers. The movable supports may be connected directly to the electronic devices or may be connected to a shelf for supporting the electronic devices. An actuator such as a servo motor may provide be operable to move the movable supports and also provide data the position of the electronic devices in the rack housing which may be correlated to the volume of the adjustable air volume based in the rack housing. For example, position of the servo motor may be correlated to the bottom of the lower most electronic device to define the upper boundary of the adjustable air volume. While the movable supports may be automatically moved via an actuator, the supports may be operably configured to be manually movable.

Figure 9:
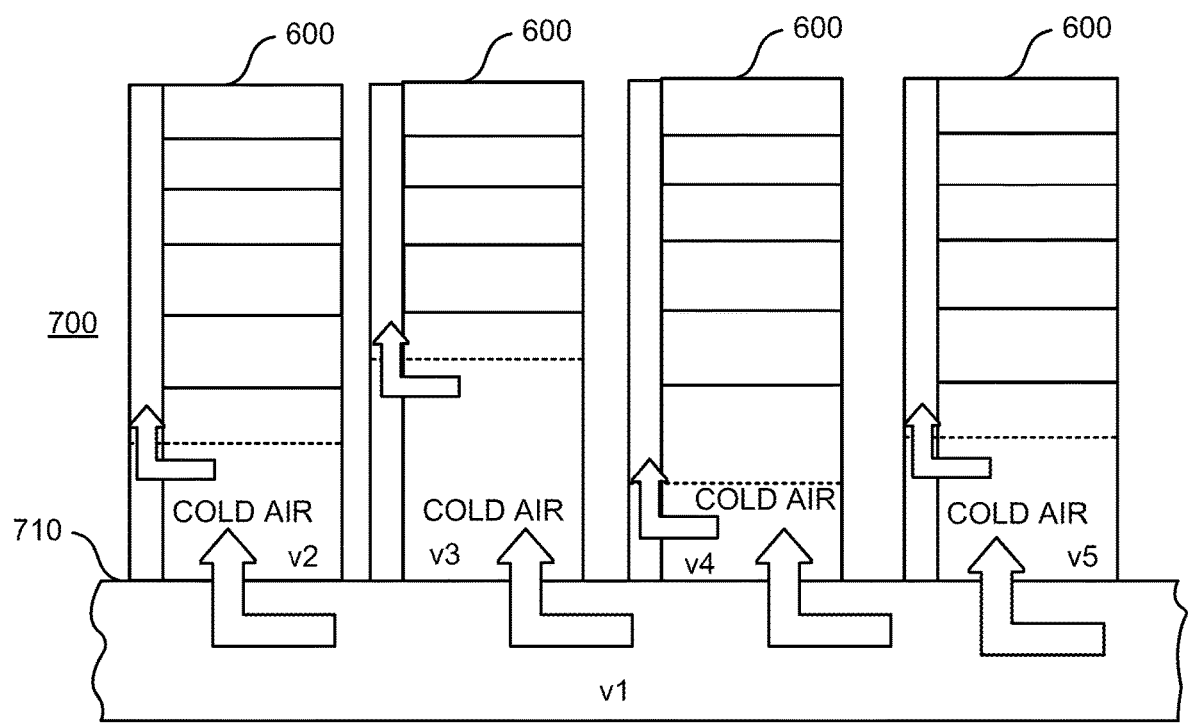
FIG. 9 is a diagrammatic illustration of a plurality of rack housing of FIG. 7.

As shown in FIG. 9, a data center 700 includes a raised floor 710 having a fixed air volume v1 (e.g., plenum) and a plurality of rack housings 600 having a plurality of adjustable air volumes v2, v3, v4, and v5 (e.g., adjustable plenums). Whereas a traditional fixed raised floor has a fixed total or global air volume (i.e., v1), the air volume of a data center employing the technique of the present disclosure would be as follows:

$$\text{Global Total Air}=v1+v2+v3+v4+v5.$$

Thus, the technique of the present disclosure, which provides a Global Total Air (e.g., v1+v2+v3+v4+v5) based on the raised floor and the adaptive air volumes in the rack housings, provides a variable factor operable for effecting the cooling supply and/or cooling capacity of the data center. In addition, varying the Global Total Air of the data center by varying the adaptive volume in one or more rack housings allows varying the cooling supply and/or cooling capacity to a rack and/or to a plurality of racks in the data center. The adaptive air volume may be dynamic such that, for example, a dynamic adaptive air volume in a rack housing or dynamic adaptive air volumes in a plurality of rack housings may respond generally in real-time to the cooling needs of a rack housing or to a plurality of rack housings in the data center.

Figure 10:
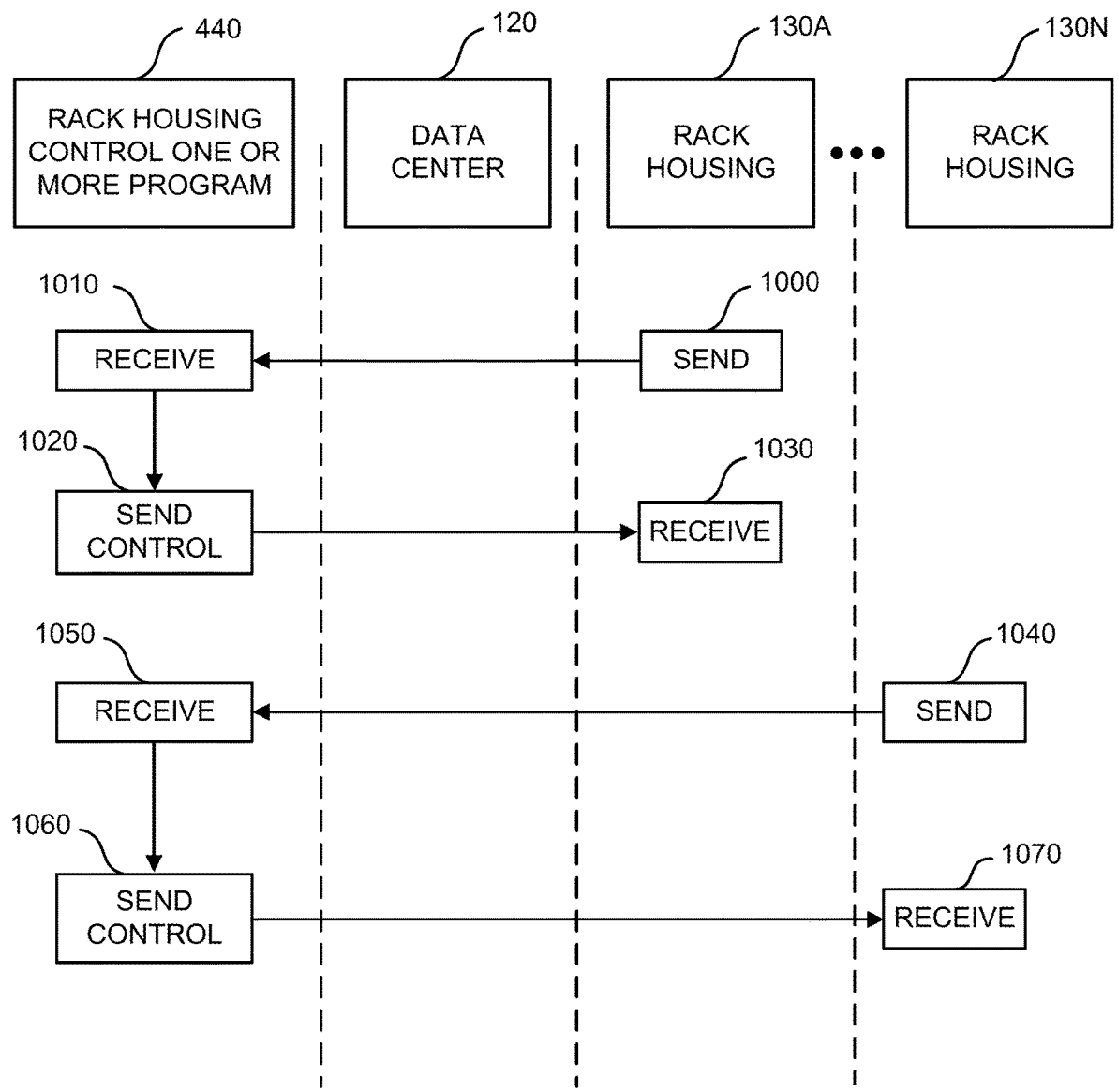
FIGS. 10-12 are diagrams illustrating processes according to embodiments of the present invention.

FIG. 10 is a diagram illustrating further aspects of a process in accordance with one or more aspects set forth herein. By way of explanation, in FIG. 10, processes are illustrated from the point of view of rack housing control one or more program 440 (e.g., display control one or more programs 440 or 441 running on rack housing control 110 of FIG. 5), data center 120 (e.g., such as data center 120 of FIG. 5), and rack housing 130A to 130N (e.g., such as rack housing 130A to 130N of FIG. 5). In one or more embodiments, one or more program 440 may run on a different collection of physical or virtual machines or processors, depending on the need for scalability of the system. In one specific example, one or more program 440 could run on a single multi-processor server system. In another specific example, various portions of one or more program 440 may run on different processors running on different computing nodes.

By way of overview, FIG. 10 illustrates, at least in part, one or more embodiments for controlling the size of an adaptive air volume in a plurality of rack housings. It will be understood that based on a different set or order of user inputs one or more program 440 can provide different functionality than the functionality described with reference to FIG. 10. For example, rack housing 130A to rack housing 130N may send data at blocks 1000, 1040 such as sensor reading data regarding the air pressure or the volume of the adaptive air volume in the rack housing, which is received at blocks 1010, 1050 at rack housing control one or more program 440. Rack housing control one or more program 440 can send data based on the sensor data at blocks 1020, 1060 for controlling the size of the adaptive air volume in the rack housing.

Figure 11:
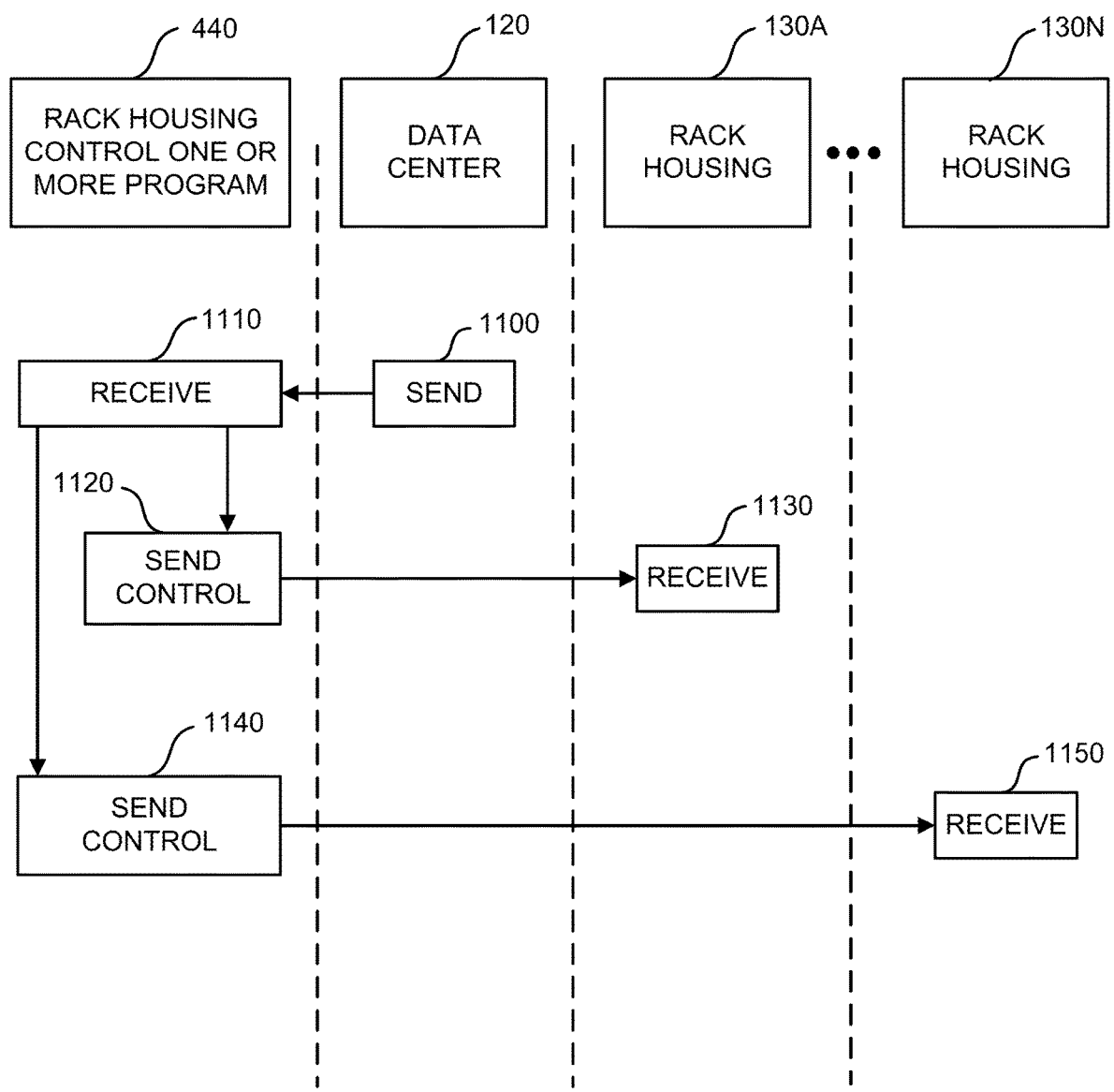

FIG. 11 is a diagram illustrating further aspects of a process in accordance with one or more aspects set forth herein. By way of explanation, in FIG. 10, processes are illustrated from the point of view of rack housing control one or more program 440 (e.g., display control one or more programs 440 or 441 running on rack housing control 110 of FIG. 5), data center 120 (e.g., such as data center 120 of FIG. 5), and rack housing 130A to 130N (e.g., such as rack housing 130A to 130N of FIG. 5). In one or more embodiments, one or more program 440 may run on a different collection of physical or virtual machines or processors, depending on the need for scalability of the system. In one specific example, one or more program 440 could run on a single multi-processor server system. In another specific example, various portions of one or more program 440 may run on different processors running on different computing nodes. For example, data center 120 may send data at block 1100 regarding the overall cooling needs of the data center, which is received at block 1110 at rack housing control one or more program 440. Rack housing control one or more program 440 can send data at blocks 1020, 1040 based on the data regarding the overall cooling needs of the data center for controlling the size of the adaptive air volume in rack housings 130A to 130N which is received at blocks 1130, 1150.

Figure 12:
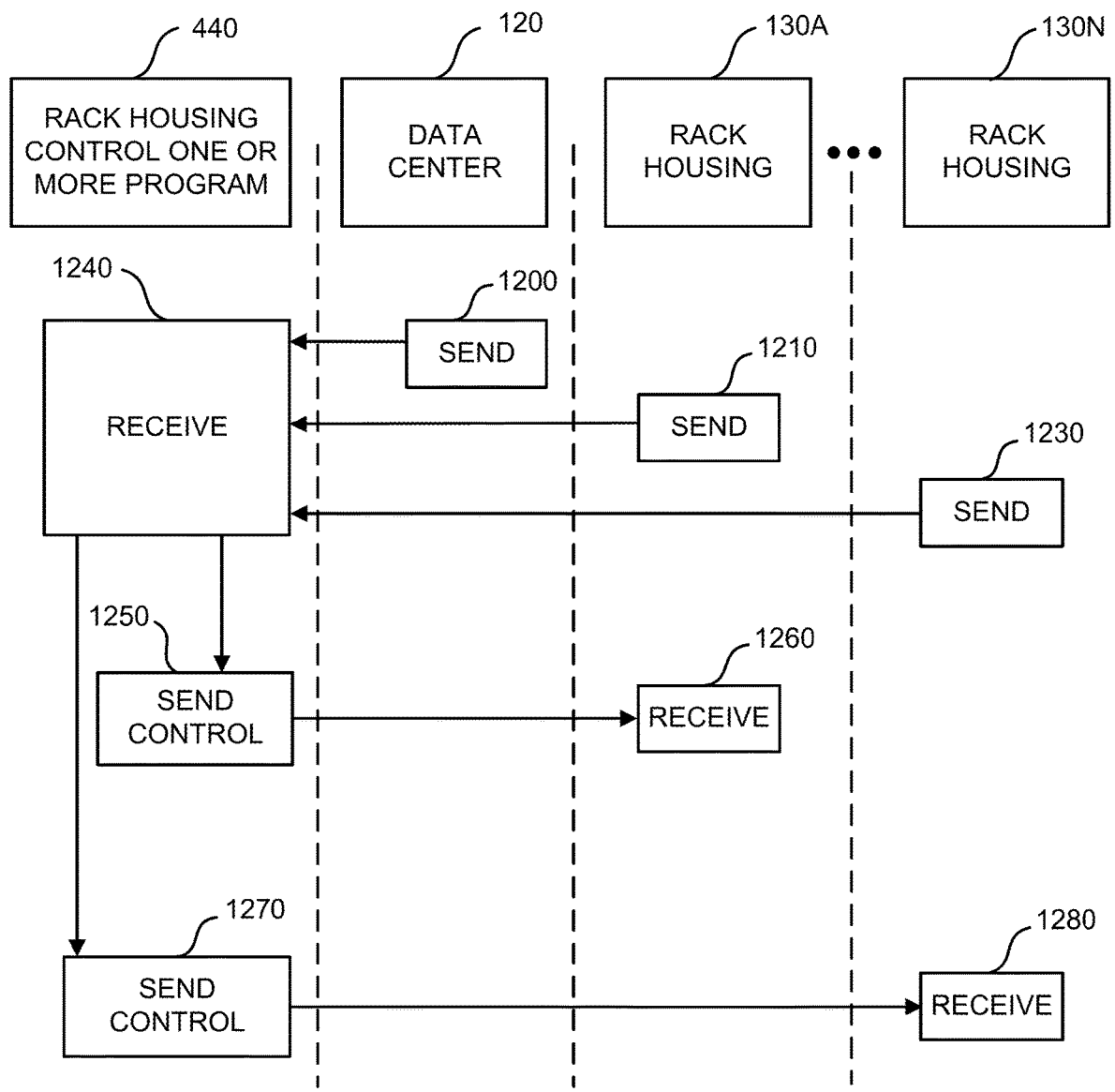

FIG. 12 is a diagram illustrating further aspects of a process in accordance with one or more aspects set forth herein. By way of explanation, in FIG. 10, processes are illustrated from the point of view of rack housing control one or more program 440 (e.g., display control one or more programs 440 or 441 running on rack housing control 110 of FIG. 5), data center 120 (e.g., such as data center 120 of FIG. 5), and rack housing 130A to 130N (e.g., such as rack housing 130A to 130N of FIG. 5). In one or more embodiments, one or more program 440 may run on a different collection of physical or virtual machines or processors, depending on the need for scalability of the system. In one specific example, one or more program 440 could run on a single multi-processor server system. In another specific example, various portions of one or more program 440 may run on different processors running on different computing nodes.

For example, data center 120 may send data at block 1200 regarding the overall cooling needs of the data center, and rack housing 130A to rack housing 130N may send data at blocks 1210, 1230 such as sensor reading data regarding the air pressure or the volume of the adaptive air volume in the rack housing, which is received at block 1240 at rack housing control one or more program 440. Rack housing control one or more program 440 can send data at blocks 1250, 1270 based on the data regarding the overall cooling needs of the data center and the sensor data for controlling the size of the adaptive air volume in rack housings 130A to 130N, which is received at blocks 1260, 1280.

As different IT resources in a data center typically need different air flow and air pressure requirements for cooling, the technique of the present disclosure provides for reconfiguration of the rack housing that may be done without any modifications to the physical structure of a data center, and reconfiguration of the rack housing does not require that the data center be shut down. The technique of the present disclosure overcomes the problem of a raised floor height in a data center that limits the overall volume of air available for cooling, and limits the ability to host different kinds of resources in a rack resulting in wasted space in the rack, poor optimization of cooling, wasted energy, and IT resource risks.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description set forth herein has been presented for purposes of illustration and description, but is not intended to be exhaustive or limited to the form disclosed. Many modifications and variations will be apparent to those of ordinary skill in the art without departing from the scope and spirit of the disclosure. The embodiment was chosen and described in order to best explain the principles of one or more aspects set forth herein and the practical application, and to enable others of ordinary skill in the art to understand one or more aspects as described herein for various embodiments with various modifications as are suited to the particular use contemplated.

What is claimed:

1. A computer-implemented method comprising:
receiving data in connection with a data center; and
controlling repositioning of a plurality of electronic devices disposed in a rack housing defining a first adjustable air volume in the rack housing in fluid communication with cooling air in a raised floor of the data center based on the data in connection with the data center so that the plurality of electronic devices in the rack housing define a second adjustable air volume in the rack housing different from the first adjustable air volume, wherein the controlling repositioning is in dependence on a monitoring of a volume of cooling air of a second rack housing of the data center.

2. The computer-implemented method of claim 1, wherein the data in connection with the data center comprises data in connection with the rack housing in the data center.

3. The computer-implemented method of claim 1, wherein the data in connection with the data center is based on an overall volume of the cooling air in the data center.

4. The computer-implemented method of claim 1, wherein the controlling comprises controlling adjustable air volumes in a plurality of rack housings.

5. The computer-implemented method of claim 1, wherein the receiving comprises receiving the data from a sensor in the rack housing, wherein the controlling comprises controlling an actuator in the rack housing for repositioning the plurality of electronic devices disposed in the rack housing, and wherein the receiving comprises receiving the data in real-time, and the controlling comprises controlling the repositioning of the plurality of electronic devices disposed in the rack housing in real-time.

6. The computer-implemented method of claim 1, wherein the repositioning of the plurality of electronic devices includes vertically moving the plurality of electronic devices up or down as a group, wherein the plurality of electronic devices remain in fixed spacing distance relative to one another while being moved.

7. The computer-implemented method of claim 1, wherein the controlling of the repositioning comprises controlling an actuator in the rack housing for repositioning the plurality of electronic devices disposed in the rack housing in response to monitoring of the volume of the first adjustable air volume.

8. The computer-implemented method of claim 1, wherein the controlling of the repositioning is in response to an overall volume of cooling air in the data center.

9. The computer-implemented method of claim 1, wherein the controlling includes causing movement of the plurality of electronic devices so that a first electronic device of the plurality of electronic devices is moved independently of a second electronic device of the plurality of electronic devices and further so that as a result of the controlling, a third adjustable air volume in the rack housing is defined, the third adjustable air volume being different than the first adjustable air volume and the second adjustable air volume.

10. The computer-implemented method of claim 1, wherein the controlling is performed in response to the data in connection with the data center, wherein the data in connection with the data center is data regarding overall cooling needs of the data center, and wherein the method includes performing the controlling to control respective sizes of respective adjustable air volumes in respective ones of a plurality of rack housings based on the data regarding overall cooling needs of the data center.

11. The computer-implemented method of claim 1, wherein the controlling is performed in response to the data in connection with the data center, wherein the data in connection with the data center is data regarding overall cooling needs of the data center, and wherein the method includes performing the controlling to control respective sizes of respective ones of adjustable air volumes in respective ones of a plurality of rack housings based on the data regarding overall cooling needs of the data center, and wherein method includes performing the controlling so that first, second and third of the plurality of rack housings have respective first, second and third different adaptive air volumes.

12. A rack housing comprising:
a frame;
a plurality of movable supports for supporting a plurality of electronic devices in said frame; and
an actuator for moving said plurality of movable supports to define an adjustable air volume in said rack housing for receiving cooling air from a raised floor of a data center, wherein the actuator is controlled in response to an overall volume of cooling air in the data center.

13. The rack housing of claim 12, further comprising a controller for controlling said actuator, said controller operable to control said actuator based on a sensor.

14. The rack housing of claim 13, wherein said sensor is operable for monitoring air pressure in the adjustable air volume.

15. The rack housing of claim 13, wherein said sensor is operable for monitoring the volume of the adjustable air volume.

16. The rack housing of claim 12, wherein the actuator is controlled in response to a monitoring of the volume of the adjustable air volume.

17. The rack housing of claim 12, wherein the actuator is controlled in dependence on a volume of cooling air of a second rack housing of the data center.

18. A rack housing comprising:
   a frame;
   a plurality of movable supports for supporting a plurality of electronic devices in said frame; and
   an actuator for moving said plurality of movable supports to define an adjustable air volume in said rack housing for receiving cooling air from a raised floor of a data center, wherein the actuator is controlled in dependence on a volume of cooling air of a second rack housing of the data center.

19. The rack housing of claim 18, further comprising a controller for controlling said actuator, said controller operable to control said actuator based on a sensor.

20. The rack housing of claim 18, wherein a sensor is operable for monitoring air pressure in the adjustable air volume.

* * * * *